(12) United States Patent
Hershkovich et al.

(10) Patent No.: US 7,630,996 B1
(45) Date of Patent: Dec. 8, 2009

(54) METHOD OF DATABASE COMPRESSION FOR DATABASE ENTRIES HAVING A PRE-DETERMINED COMMON PART

(75) Inventors: Moshe Hershkovich, Netanya (IL); Moshe Stark, Even Yehuda (IL)

(73) Assignee: Hywire Ltd., Netanya (IL)

( * ) Notice: Subject to any disclaimer, the term of this patent is extended or adjusted under 35 U.S.C. 154(b) by 225 days.

(21) Appl. No.: 11/047,573

(22) Filed: Feb. 2, 2005

(51) Int. Cl.
G06F 7/00 (2006.01)
G06F 17/00 (2006.01)
G06F 12/00 (2006.01)

(52) U.S. Cl. ............... 707/101; 711/108; 365/49.1

(58) Field of Classification Search .............. 707/101; 711/219, 108; 341/51; 365/49.1
See application file for complete search history.

(56) References Cited

U.S. PATENT DOCUMENTS

| | | | |
|---|---|---|---|
| 6,756,922 B2 * | 6/2004 | Ossia | 341/51 |
| 7,200,603 B1 * | 4/2007 | Hitz et al. | 707/101 |
| 2003/0093646 A1 | 5/2003 | Stark | 711/108 |
| 2004/0019737 A1 | 1/2004 | Kastoriano et al. | 711/104 |
| 2004/0049630 A1 | 3/2004 | Stark | 711/108 |

OTHER PUBLICATIONS

Ahmed et al; A New Configuration Of Single Phase Symmetrical PWM Chopper Voltage Controller, IEEE Transactions on Industrial Electronics vol. 46 Issue 5 pp. 942-652—Oct. 1999.

U.S. Appl. No. 10/928,257, filed Aug. 30, 2004, in the name of Hershkovich et al.
Pasi Ojala "Compression Basics" (http://www.cs.tut.fi/-albert/dev/pucrunch/packing.html).
"Introduction/Lossless Data Compression" (http://www.vectorsite.net/ttdcmpl.html).
"Lossless Data Compression" http://www.data-compression.com/lossless.html).

* cited by examiner

*Primary Examiner*—Hosain T Alam
*Assistant Examiner*—Ann J Chempakaseril
(74) *Attorney, Agent, or Firm*—Mark M. Friedman (57) ABSTRACT

A computer-implemented method of compressing data entries in a database, including the steps of: (a) inputting a plurality of uncompressed data entries; (b) dividing a particular uncompressed data entry, in a pre-determined manner, into at least two sections of significant bits, the two sections including both a common section and a differentiating section with respect to other the uncompressed data entries; (c) determining, by comparison of the particular data entry with a monotonically-adjacent entry, if a match exists in the common section; and (d) providing a particular compressed entry for the particular data entry, the compressed entry including compressed data corresponding to the particular data entry, wherein if, in step (c), the match exists in the common section, the compressed data includes at least a portion of the differentiating section of the particular data entry.

19 Claims, 2 Drawing Sheets

METHOD OF DATABASE COMPRESSION FOR DATABASE ENTRIES HAVING A PRE-DETERMINED COMMON PART

FIELD AND BACKGROUND OF THE INVENTION

The present invention relates to methods of lossless database compression and, more particularly, to a method of lossless database compression for groups of database entries having a pre-determined common part.

Data compression techniques are well-known in the art. Lossless data compression is used when the data has to be uncompressed exactly as it was before compression. Text files are stored using lossless techniques, since losing a single character can make the text misleading or incomprehensible. Archival storage of master sources for images, video data, and audio data generally needs to be lossless as well.

In prior-art methods of lossless data compression, the essential figure of merit for data compression is the "compression ratio", or ratio of the size of a compressed file to the original uncompressed file. However, there are strict limits to the amount of compression that can be obtained with lossless compression. Lossless compression ratios are generally in the range of 2:1 to 8:1.

One of the simplest forms of data compression is known as "run length encoding" (RLE), which is sometimes known as "run length limiting" (RLL). A more sophisticated approach to lossless data compression is Huffman coding, in which short codewords are assigned to those input blocks having high probabilities and long codewords are assigned to those input blocks having low probabilities. A Huffman code is designed by merging together the two least probable characters, and repeating this process until there is only one character remaining. A code tree is thus generated and the Huffman code is obtained from the labeling of the code tree.

One particularly popular and efficient method utilizes the Lempel-Ziv algorithm, which is a variable-to-fixed length code. In the Lempel-Ziv algorithm, the input sequence is parsed into non-overlapping blocks of different lengths while constructing a dictionary of blocks seen thus far. The Lempel-Ziv algorithm exploits the fact that words and phrases within a text file are likely to be repeated. When they do repeat, they can be encoded as a pointer to an earlier occurrence, with the pointer accompanied by the number of characters to be matched.

Pointers and uncompressed characters are distinguished by a leading flag bit, with a "0" indicating a pointer and a "1" indicating an uncompressed character. This means that uncompressed characters are extended from 8 to 9 bits, which works against compression to a small degree.

One key to the operation of the Lempel-Ziv algorithm is a sliding history buffer, also known as a "sliding window", which stores the text most recently transmitted. When the buffer fills up, the oldest contents thereof are discarded. The size of the buffer is important: if the buffer size is too small, finding string matches will be less likely; if too large, the pointers will be larger, working against compression.

Surveys of the most basic and prevalent lossless data compression techniques include: Pasi Ojala, "Compression Basics", (http://www.cs.tut.fi/~albert/Dev/pucrunch/packing.html); "Introduction/Lossless Data Compression", (http://www.vectorsite.net/ttdcmp1.html), and "Lossless Data Compression" (http://www.data-compression.com/lossless.html). Additional surveys are widely available in the literature.

Given a specific type of file, the contents of the file, particularly the orderliness and redundancy of the data, can strongly influence the compression ratio. In some cases, using a particular data compression technique on a data file where there isn't a good match between the two can actually result in a bigger file. Thus, it is essential to tailor data compression techniques to specific applications and specific data patterns.

Data compression would appear to be important for search-engine type applications. The essential figures of merit for data compression for such applications are not limited to the compression ratio and lossless transformation. Search-engine type applications have a host of additional requirements for data compression techniques, including the ability to conduct fast searches, preferably in a deterministic fashion, and including easily-manageable updating or maintenance of the database.

There is therefore a recognized need for, and it would be highly advantageous to have, a lossless data compression method that is specifically developed and adapted for search-engine type applications, a method that achieves satisfactory compression ratios while enabling deterministic searching and facile maintenance of the database.

SUMMARY OF THE INVENTION

The present invention is a method of database compression for groups of database entries having a pre-determined common part.

According to the teachings of the present invention there is provided a computer-implemented method of compressing data entries in a database, the method including the steps of: (a) inputting a plurality of uncompressed data entries; (b) dividing a particular uncompressed data entry of the uncompressed data entries, in a pre-determined manner, into at least two sections of significant bits, the at least two sections including both a common section and a differentiating section with respect to other the uncompressed data entries; (c) determining, by comparison of the particular data entry with a monotonically-adjacent entry, if a match exists in the common section, and (d) providing a particular compressed entry for the particular data entry, the compressed entry including compressed data corresponding to the particular data entry, wherein if, in step (c), the match exists in the common section, the compressed data includes at least a portion of the differentiating section of the particular data entry.

According to further features in the described preferred embodiments, the compressed data corresponds solely to the particular data entry, and solely includes at least a portion of the differentiating section.

According to still further features in the described preferred embodiments, when a no-match condition exists in the common section, the method further includes the step of: (e) inserting a virtual compressed entry between the particular compressed entry and the monotonically-adjacent entry.

According to still further features in the described preferred embodiments, the virtual compressed entry includes data corresponding to the common section of the data entry.

According to still further features in the described preferred embodiments, a change in the database from the monotonically-adjacent entry and the virtual compressed entry is indicated by a tag.

According to still further features in the described preferred embodiments, the above-mentioned difference exists in the common section, and the method further includes the step of: (e) providing an indication of the difference.

According to still further features in the described preferred embodiments, the indication is indicated by a tag.

According to still further features in the described preferred embodiments, the compressed data of the particular entry includes at least a portion of the common section.

According to still further features in the described preferred embodiments, the compressed data corresponds solely to the particular data entry, and solely includes at least a portion of the differentiating section.

According to still further features in the described preferred embodiments, the common section includes a higher-level section of more significant bits and the differentiating section includes a lower-level section of less significant bits.

According to still further features in the described preferred embodiments, the differentiating section includes a higher-level section of more significant bits and the common section includes a lower-level section of less significant bits.

According to still further features in the described preferred embodiments, at least two specific entries of the plurality of uncompressed data entries have an identical common section, and the identical common section is extracted from the specific entries, and is stored in the database.

According to still further features in the described preferred embodiments, the particular compressed entry, along with the identical common section and the indication, contain information requisite for an exact reconstruction of the particular uncompressed data entry.

According to still further features in the described preferred embodiments, the method further includes the steps of: (e) providing respective compressed entries for the plurality of uncompressed data entries, each of the respective compressed entries including compressed data corresponding to a specific one of the uncompressed data entries, and (f) arranging the compressed entries in a physically monotonic order.

According to still further features in the described preferred embodiments, when a no-match condition exists in the common section, the method further includes the step of: (e) inserting a virtual compressed entry between the particular compressed entry and the monotonically-adjacent entry.

According to still further features in the described preferred embodiments, the virtual compressed entry includes data corresponding to the common section of the data entry.

According to still further features in the described preferred embodiments, the difference exists in the common section, and the method further includes the step of: (e) providing an indication of the difference.

According to yet another aspect of the present invention there is provided a computer-implemented method of compressing data entries in a database, the method including the steps of: (a) inputting a plurality of uncompressed data entries; (b) extracting a pre-determined number of bits from each of the uncompressed data entries, so as to produce, for each particular uncompressed data entry of the entries: (i) a common section of bits, and (ii) a compressed data entry; (c) storing the compressed data entry in the database, wherein, for a particular plurality of the uncompressed data entries, each having a particular compressed data entry so as to form a plurality of particular compressed data entries, the common section of bits is an identical common section of bits, and (d) storing the identical common section of bits in a single register operatively associated with the plurality of particular compressed data entries.

According to further features in the described preferred embodiments, the plurality of particular compressed data entries is stored in monotonic order within the database.

According to still further features in the described preferred embodiments, the plurality of particular compressed data entries is stored in monotonic order in rows within the database, and the register is part of a column register, each row of the column register being associated with a row of the rows within the database.

According to still further features in the described preferred embodiments, the common section of bits includes a section of most significant bits.

DESCRIPTION OF THE PREFERRED EMBODIMENTS

The present invention is a method of database compression for groups of database entries having a pre-determined common part.

The principles and operation of the data compression method according to the present invention may be better understood with reference to the description and tables provided hereinbelow.

Before explaining at least one embodiment of the invention in detail, it is to be understood that the invention is not limited in its application to the details of construction and the arrangement of the components set forth in the following description. The invention is capable of other embodiments or of being practiced or carried out in various ways. Also, it is to be understood that the phraseology and terminology employed herein is for the purpose of description and should not be regarded as limiting.

The present invention discloses an inventive method for compressing a database having groups of entries having a pre-determined common part. The method can be used to compress databases stored in any type of storage device, such as ROM, EPROM, E$^2$ROM, Flash-Based, Optical, Static or Dynamic RAM (SRAM or DRAM, respectively). The disclosed compression methods can be used to increase the number of entries stored in any Associative Search Engine (ASE), such as a Binary CAM, Ternary CAM, algorithmic search engine or the Range Search Engine (RSE) of HyWire Ltd., or alternatively, to store the same number of entries in a smaller memory.

In particular, the disclosed methods may serve to compress data in RAM-Based CAM configurations presented in previous co-pending U.S. Patent Applications assigned to HyWire Ltd.—RAM-Based Binary CAM, dealing with binary integers (integers with single values), disclosed in U.S. Patent Application Publication No. 20040049630, and RAM-Based RCAM, used for range integers (integers within a range of values) disclosed in U.S. Patent Application Publication No. 20030093646. These compression methods can be extended to Multi-RAM Binary CAM and RCAM configurations, as disclosed in U.S. Patent Application Publication No. 20040019737.

The compression method disclosed herein has two basic variants, designated "Key Tagging" and "Memory Partitioning", which are applicable when the database entries have a pre-determined part (designated "common part" or "common section") that changes infrequently in a systematic pattern. The entries having an identical common section can be grouped; the common parts of the different groups can be arranged and stored in another memory, or in another memory partition, and associated with the database entries of the respective groups (designated "compressed entries") where the common part is omitted, enabling significant storage saving.

These methods can be regarded as particular applications in the context of more general rules for handling common terms in groups of entries, where the common term part of the entry can be extracted from the group and the varying part kept within the group in a compressed form, for instance:

$$(a+b, a+c, a+d \ldots, a+z) \rightarrow a+(b,c,d, \ldots, z)$$

$$(a \cdot b, a \cdot c, a \cdot d, \ldots, a \cdot z) \rightarrow a \cdot (b,c,d, \ldots, z)$$

The inventive compression method can be implemented when an ASE is used in conjunction with an external memory that enhances the ASE storage capabilities, as disclosed in U.S. Patent Application Publication No. 20040083336, entitled "Multi-Dimensional Associative Search Engine Having An External Memory". Then, the common part can be stored in the ASE internal memory and the compressed entries in an external memory.

When a RAM-Based Binary CAM or RCAM is implemented in an RSE, a First Column Register (FC-Register) may be used to store the uncompressed entries corresponding to the rows of an internal or external RAM that contain the compressed entries with the same common part. The FC-Register may contain, besides the uncompressed entries, associated Row Index entries that point to the physical RAM rows corresponding to the uncompressed entries; this type of arrangement was disclosed in a co-pending U.S. patent application entitled "Database Storage and Maintenance Using Row Index Ordering" (Ser. No. 10/928,257). The row index pointers determine the row ordering, so the RAM rows can be arranged in a flexible non-contiguous order. Within the individual RAM rows, the compressed entries can be ordered monotonically, or more generally, in cyclic monotonic order, where the monotonic order is maintained, but the lowest value entry is not necessarily positioned at the beginning of the row. In this case, Column Index entries may be required in the FC-Register to indicate the position of the lowest value entry in each row; this arrangement is not exemplified in this application.

When Multi-RAM Binary CAM and RCAM configurations are used, a First Column RAM (FC-RAM) may store the uncompressed entries while the multiple RAMs store the corresponding rows of the compressed entries. The two compression methods are described below for RAM-Based Binary CAM or RCAM implementations but can be straightforwardly extended to Multi-RAM configurations.

Key Tagging Method

In the simplest application of the Key Tagging method, each uncompressed entry is partitioned into two parts: a "common part" and a "compressed entry", where each part can be handled as a field. When this method is implemented in a RAM-Based Binary CAM or RCAM, the FC-Register stores the uncompressed entries of the first column of the internal or external RAM, whereas the RAM itself stores the corresponding compressed entries. As the uncompressed entries change but the common part remains equal, each compressed entry in the RAM is tagged with an indicating bit (e.g., "0") indicating that the common part has not changed; thus, all the contiguous compressed entries with this bit value share a common part and are stored in compressed form by omitting this part. When the common part changes, the compressed entry carries the value of the new common part only and is tagged with a different bit value (e.g., "1") indicating this status. In this way, only the compressed entries along with the associated tagging bits are stored in the RAM instead of the entire uncompressed entries, yielding significant storage saving. Each uncompressed entry can be partitioned into two equal parts or more generally into two unequal parts or fields; however, when the same number of bits is assigned to all compressed entries, common parts with fewer bits than the compressed entries are used.

Table 1 shows an application of this method for compressing CIDR IPv4 addresses composed of 32 bits arranged in four octets (8-bit numbers) and represented in dotted-decimal notation. In this example, the CIDR IPv4 addresses are partitioned into two parts or fields of equal length, each consisting of two octets. The common part consists of the two more significant octets (MSOs) and the compressed entry contains in most cases (when the common part does not change) only the two less significant octets (LSOs). In these cases, each compressed entry in the RAM is tagged with an indicating (MSO or LSO, or "MSO/LSO") bit=0, indicating that the two LSOs are listed in the RAM. When the common part changes, the compressed entry representing the new uncompressed value is tagged with the MSO/LSO bit=1, indicating that it carries the value of the two MSOs (the common part).

TABLE 1

"Key Tagging" Compression of CIDR IPv4 Entries with Common Parts and Compressed Entries of Equal Lengths

| Uncompressed Entries | Compressed Entries | |
|---|---|---|
| | MSO/LSO Tag Bit | Data |
| 152.15.0.0 | → | 1 | 152.15 |
| 152.15.3.0 | → | 0 | 3.0 |
| 152.15.6.3 | → | 0 | 6.3 |
| 152.15.9.5 | → | 0 | 9.5 |
| 152.16.0.0 | → | 1 | 152.16 |
| 152.16.5.6 | → | 0 | 5.6 |
| 152.16.8.1 | → | 0 | 8.1 |
| 152.16.32.0 | → | 0 | 32.0 |
| 152.17.0.0 | → | 1 | 152.17 |
| 152.17.6.0 | → | 0 | 6.0 |
| 152.17.35.2 | → | 0 | 35.2 |
| 153.22.0.0 | → | 1 | 153.22 |
| 154.3.0.0 | → | 0 | 154.3 |
| 154.3.8.7 | → | 0 | 8.7 |
| 155.16.0.0 | → | 1 | 155.16 |
| 155.16.15.5 | → | 0 | 15.5 |
| 156.5.0.0 | → | 1 | 155.16 |
| 156.5.20.8 | → | 0 | 20.8 |

In most cases, each group of CIDR IPv4 addresses having the same two MSOs (the common part) starts with two zero LSOs, as shown in Table 1. However, if a new group of CIDR IPv4 addresses starts with non-zero LSOs, virtual addresses with two zero LSOs (such as the shaded addresses shown in Table 2) must be inserted to make this method applicable. In this case, each virtual address may be associated with a "Virtual bit"=1 (in contrast to a "Virtual bit"=0 assigned to an actual address); then, if a key search yields a virtual address as an exact match (for a Binary CAM) or a range match (for an RCAM), a "Virtual bit"=1 indicates that the matched entry is not an actual entry and cannot be a true exact match. The Associated Data (AD) entry corresponding to a virtual entry may be equal to that of the preceding actual entry. The "Virtual bit" may be included in the AD corresponding to a virtual address, so that this address is handled as an actual address in a key search, but the matching AD equals that of the preceding actual entry.

The CIDR IPv4 addresses are listed in the tables above as one-dimensional arrays. They can be arranged as two-dimensional arrays (TDAs) in RAM-Based Binary CAMs or RCAMs. Then, an FC-Register can be used to store the uncompressed entries corresponding to the rows of a RAM that contain the compressed entries along with the associated MSO/LSO Tag bits. Table 3 shows the entries listed in Table 2, where the compressed entries are arranged in a RAM with four entries per row and the uncompressed entries of the RAM first column are listed in an FC-Register.

Large databases can be arranged similarly in Multi-RAM Binary CAM and RCAM configurations, using an FC-RAM to store the uncompressed entries and the multiple RAMs to store the corresponding rows with the compressed entries.

It must be emphasized that the compression methods of the present invention are deterministic in that the number of steps required for compression, and the number of steps required for a search in response to an input key both have a predetermined upper limit.

Figure 1:
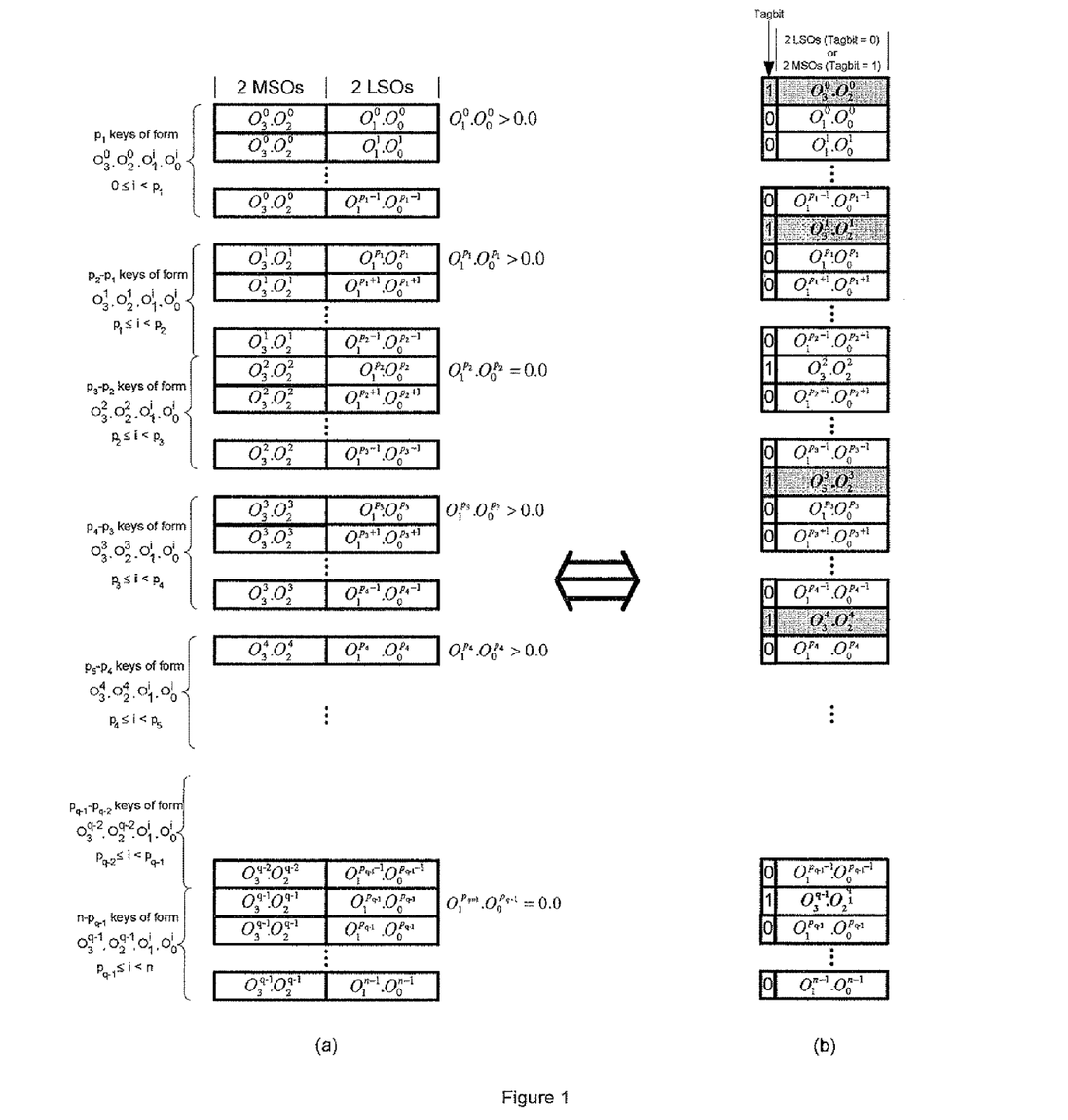
FIG. 1 is a schematic depiction of an IPv4 database Linear Array (a) and the equivalent compressed (lossless) Linear Array (b)

Referring now to the figures, FIG. 1 is a schematic depiction of an IPv4 database Linear Array (a) and the equivalent compressed (lossless) Linear Array (b).

FIG. 1 is a generalization of the compression method demonstrated in the Table 2 example, which divides the key into two parts:

$O_1 \cdot O_0$—The two Least Significant Octets (2 LSOs)

$O_3 \cdot O_2$—The two Most Significant Octets (2 MSOs)

By using a Tag Bit (Tagbit), the compressed linear array defines whether the 2 octets are the 2 LSOs (Tagbit=0), or the 2 MSOs (Tagbit=1).

DEFINITIONS n—number of IPv4 address entries q—number of different 2 MSOs values $O_0^j$—The least significant (the rightmost) octet in the j-th IPv4 key entry.

$O_3^j$—The most significant (the leftmost) octet of the j-th IPv4 key entry.

$O_1^j$—The octet to the right of $O_0^j$.

$O_2^j$—The octet to the left of $O_0^j$.

2 MSOs—$O_3^j \cdot O_2^j$

2 LSOs—$O_1^j \cdot O_0^j$

Relations:

$$O_3^0 \cdot O_2^0 < O_3^1 \cdot O_2^1 < \ldots < O_3^{q-1} \cdot O_2^{q-1}$$

For any $O_3^j \cdot O_2^j$, $$O_1^{pj} \cdot O_0^{pj} < O_1^{pj+1} \cdot O_0^{pj+1} < \ldots < O_1^{pj+1} \cdot O_0^{pj+1}, \text{ and}$$
$$0 \leq j < q-1$$

or $$O_1^{pj} \cdot O_0^{pj} < O_1^{pj+1} \cdot O_0^{pj+1} < \ldots < O_1^{n-1} \cdot O_0^{n-1}, \text{ and}$$
$$0 \leq j = q-1$$

Figure 2:
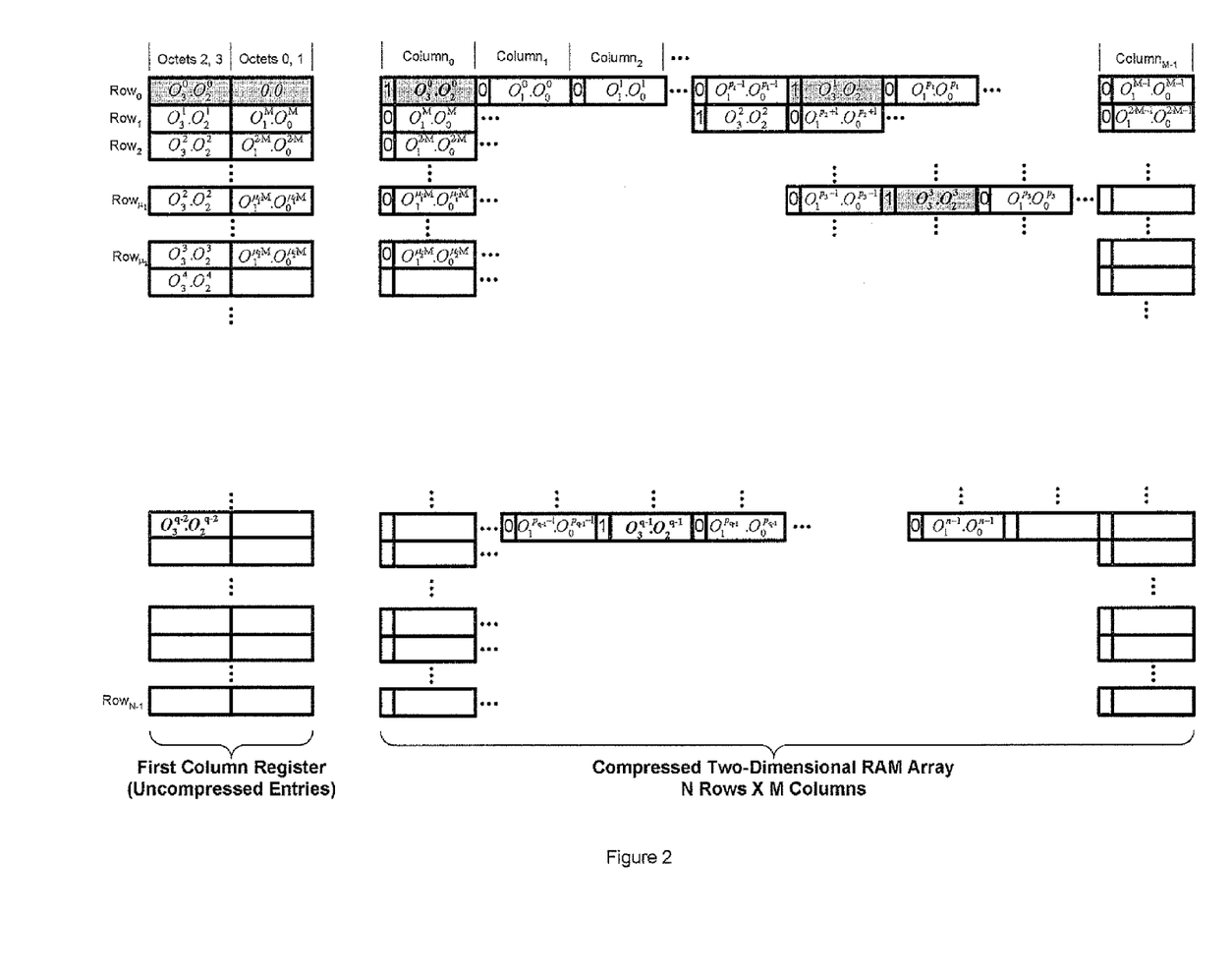
FIG. 2 is a Two-Dimensional RAM Array (M Columns×N Rows), equivalent to the Compressed Linear Array provided in FIG. 1.

FIG. 2 is a Two-Dimensional RAM Array (M Columns×N Rows), equivalent to the Compressed Linear Array provided in FIG. 1.

TABLE 2

"Key Tagging" Compression of CIDR IPv4 Entries with Virtual Entries Having Common Parts and Compressed Entry of Equal Lengths

| Uncompressed Actual Entries | | Uncompressed Actual & Virtual Entries | | Compressed Actual & Virtual Entries | |
|---|---|---|---|---|---|
| | | | | MSO/LSO Tag Bit | Data |
| 152.15.0.0 | → | 152.15.0.0 | → | 1 | 152.15 |
| 152.15.3.0 | → | 152.15.3.0 | → | 0 | 3.0 |
| 152.15.6.3 | → | 152.15.6.3 | → | 0 | 6.3 |
| 152.15.9.5 | → | 152.15.9.5 | → | 0 | 9.5 |
| | → | 152.16.0.0 | → | 1 | 152.16 |
| 152.16.2.3 | → | 152.16.2.3 | → | 0 | 2.3 |
| 152.16.5.6 | → | 152.16.5.6 | → | 0 | 5.6 |
| 152.16.8.1 | → | 152.16.8.1 | → | 0 | 8.1 |
| 152.16.32.0 | → | 152.16.32.0 | → | 0 | 32.0 |
| | → | 152.17.0.0 | → | 1 | 152.17 |
| 152.17.3.3 | → | 152.17.3.3 | → | 0 | 3.3 |
| 152.17.6.0 | → | 152.17.6.0 | → | 0 | 6.0 |
| 152.17.35.2 | → | 152.17.35.2 | → | 0 | 35.2 |
| | → | 153.22.0.0 | → | 1 | 153.22 |
| 153.22.10.1 | → | 153.22.10.1 | → | 0 | 10.1 |
| 153.22.33.2 | → | 153.22.33.2 | → | 0 | 33.2 |
| | → | 154.3.0.0 | → | 1 | 154.3 |
| 154.3.3.6 | → | 154.3.3.6 | → | 0 | 3.6 |
| 154.3.8.7 | → | 154.3.8.7 | → | 0 | 8.7 |
| | → | 155.16.0.0 | → | 1 | 155.16 |
| 155.16.7.15 | → | 155.16.7.15 | → | 0 | 7.15 |
| 155.16.15.5 | → | 155.16.15.5 | → | 0 | 15.5 |
| 156.5.0.0 | → | 156.5.0.0 | → | 1 | 156.5 |
| 156.5.20.8 | → | 156.5.20.8 | → | 0 | 20.8 |

TABLE 3

"Key Tagging" Compression of CIDR IPv4 Entries with Common Parts and Compressed Entry of Equal Lengths Stored in a RAM

| FC-Register (Uncompressed Entries) | RAM (Compressed Entries) | | | | | | | |
|---|---|---|---|---|---|---|---|---|
| | Tag | Data | Tag | Data | Tag | Data | Tag | Data |
| 152.15.0.0 | 1 | 152.15 | 0 | 3.0 | 0 | 6.3 | 0 | 9.5 |
| 152.16.0.0 | 1 | 152.16 | 0 | 2.3 | 0 | 5.6 | 0 | 8.1 |
| 152.16.32.0 | 0 | 32.0 | 1 | 152.17 | 0 | 3.3 | 0 | 6.0 |

TABLE 3-continued

"Key Tagging" Compression of CIDR IPv4 Entries with Common Parts and Compressed Entry of Equal Lengths Stored in a RAM

| FC-Register (Uncompressed Entries) | RAM (Compressed Entries) | | | | | | |
|---|---|---|---|---|---|---|---|
| | Tag | Data | Tag | Data | Tag | Data | Tag | Data |
| 152.17.35.2 | 0 | 35.2 | 1 | 153.22 | 0 | 10.1 | 0 | 33.2 |
| 154.3.0.0 | 1 | 154.3 | 0 | 3.6 | 0 | 8.7 | 1 | 155.16 |
| 155.16.7.15 | 0 | 7.15 | 0 | 15.5 | 1 | 156.5 | 0 | 20.8 |

A key search in the RAM-Based Binary CAM or RCAM can be completed in two steps. In the first step, a search is performed by a Search Row Locator in the FC-Register to identify the TDA row where the submitted key may be located. This step is identical for Binary CAMs and RCAMs, and involves comparisons of uncompressed entries. In the second step, the row identified in the first step is searched for an exact match (for a Binary CAM) or a range match (for an RCAM); this step is more involved, it is performed using a sophisticated Search Column Locator, and depends whether the two LSOs of the submitted key are both zero or at least one is non-zero.

If the submitted key has two zero LSOs, they are disregarded and the two MSOs (the common part) are compared with the two MSOs of the RAM entries (having a Tag bit MSO/LSO=1). If the comparison yields an exact match, such as for the submitted key 154.3.0.0 in Table 3, then the matched entry is a positive result for either a Binary CAM or an RCAM. If an exact match is not found, as in the case of the submitted key 154.8.0.0, then the search yields a range match, e.g., 154.3.8.7. Since 154.3.0.0 is a virtual address, it is associated with "Virtual bit"=1, indicating that this address is not a true exact match; the corresponding AD entry in this case is equal to that of the preceding actual entry, i.e., 153.22.33.2.

If the submitted key has at least one non-zero LSO, then its two MSOs are first compared with the two MSOs of the RAM entries (with a Tag bit MSO/LSO=1); this comparison determines a search range between an equal (or lower) value and the next higher value. For example, in the case of the submitted keys 154.3.3.6, 154.3.4.5 and 154.8.4.5, the search range lies between 154.3.0.0 and 155.16.0.0. Then, the two LSOs of the submitted key are compared with the two LSOs of the RAM entries (having a Tag bit MSO/LSO=0) within the specified search range. This comparison may yield an exact match, as for the submitted key 154.3.3.6, or range matches for 154.3.4.5 and 154.8.4.5, i.e., 154.3.3.6 and 154.3.8.7, respectively.

Table 4 shows an alternative example of "Key Tagging" Compression applied to CIDR IPv4 addresses similar to those listed in Table 1. In this example, however, the CIDR IPv4 addresses are partitioned into two unequal parts or fields. The common part consists of the more significant octet (MSO) and the compressed entry contains in most cases (when the common part does not change) the three less significant octets (LSOs). In these cases, each compressed entry in the RAM is tagged with a bit MSO/LSO=0, indicating that the three LSOs are listed in the RAM. When the common part changes, the compressed entry representing the new uncompressed value is tagged with the bit MSO/LSO=1, indicating that it carries the value of the single MSO (the common part). Similarly to Table 2, if a new group of CIDR IPv4 addresses starts with three non-zero LSOs, a virtual address (shown shaded) with three zero LSOs must be inserted to make this method applicable. The virtual address may be associated with a "Virtual bit"=1, indicating that the matched entry is not an actual entry and cannot be a true exact match; the corresponding AD in this case may be equal to that of the preceding actual entry.

TABLE 4

"Key Tagging" Compression of CIDR IPv4 Entries with Virtual Entries Having Common Parts and Compressed Entry of Unequal Lengths

| Uncompressed Actual Entries | Uncompressed Actual & Virtual Entries | Compressed Actual & Virtual Entries | |
|---|---|---|---|
| | | MSO/LSO Tag Bit | Data |
| | → 152.0.0.0 | → 1 | 152 |
| 152.15.0.0 | → 152.15.0.0 | → 0 | 15.0.0 |
| 152.15.3.0 | → 152.15.3.0 | → 0 | 15.3.0 |
| 152.15.6.3 | → 152.15.6.3 | → 0 | 15.6.3 |
| 152.15.9.5 | → 152.15.9.5 | → 0 | 15.9.5 |
| 152.16.2.3 | → 152.16.2.3 | → 0 | 16.2.3 |
| 152.16.5.6 | → 152.16.5.6 | → 0 | 16.5.6 |
| 152.16.8.1 | → 152.16.8.1 | → 0 | 16.8.1 |
| 152.16.32.0 | → 152.16.32.0 | → 0 | 16.32.0 |
| 152.17.3.3 | → 152.17.3.3 | → 0 | 17.3.3 |
| 152.17.6.0 | → 152.17.6.0 | → 0 | 17.6.0 |
| 152.17.35.2 | → 152.17.35.2 | → 0 | 17.35.2 |
| | → 153.0.0.0 | → 1 | 153 |
| 153.22.10.1 | → 153.22.10.1 | → 0 | 22.10.1 |
| 153.22.33.2 | → 153.22.33.2 | → 0 | 22.33.2 |
| | → 155.0.0.0 | → 1 | 155 |
| 155.3.3.6 | → 155.3.3.6 | → 0 | 3.3.6 |
| 155.3.8.7 | → 155.3.8.7 | → 0 | 3.8.7 |
| | → 156.0.0.0 | → 1 | 156 |
| 156.16.7.15 | → 156.16.7.15 | → 0 | 16.7.15 |
| 156.16.15.5 | → 156.16.15.5 | → 0 | 16.15.5 |
| | → 157.0.0.0 | → 1 | 157 |
| 157.5.0.0 | → 157.5.0.0 | → 0 | 5.0.0 |
| 157.5.20.8 | → 157.5.20.8 | → 0 | 5.20.8 |

Table 5 shows the entries listed in Table 4, where the compressed entries are arranged in a RAM with four entries per row and the uncompressed entries of the RAM first column are listed in an FC-Register.

TABLE 5

"Key Tagging" Compression of CIDR IPv4 Entries with Common Parts
and Compressed Entry of Unequal Lengths Stored in a RAM

| FC-Register (Uncompressed Entries) | RAM (Compressed Entries) | | | | | | |
|---|---|---|---|---|---|---|---|
| | Tag | Data | Tag | Data | Tag | Data | Tag | Data |
| 152.0.0.0 | 1 | 152 | 0 | 15.0.0 | 0 | 15.3.0 | 0 | 15.6.3 |
| 152.15.9.5 | 0 | 15.9.5 | 0 | 16.2.3 | 0 | 16.5.6 | 0 | 16.8.1 |
| 152.16.32.0 | 0 | 16.32.0 | 0 | 17.3.3 | 0 | 17.6.0 | 0 | 17.35.2 |
| 153.0.0.0 | 1 | 153 | 0 | 22.10.1 | 0 | 22.33.2 | 1 | 155 |
| 155.3.3.6 | 0 | 3.3.6 | 0 | 3.8.7 | 1 | 156 | 0 | 16.7.15 |
| 156.16.15.5 | 0 | 16.15.5 | 1 | 157 | 0 | 5.0.0 | 0 | 5.20.8 |

As in the previous example, a key search in a RAM-Based Binary CAM or RCAM can be completed in two steps. In the first step, a search is performed by a Search Row Locator in the FC-Register to identify the TDA row where the submitted key may be located. This step involves comparisons of uncompressed entries. In the second step, the row identified in the first step is searched for an exact match (for a Binary CAM) or a range match (for an RCAM); this step is more involved, it is performed using a sophisticated Search Column Locator, and depends whether the three LSOs of the submitted key are zero or at least one is non-zero.

If the submitted key has three zero LSOs, they are disregarded and the MSO (the common part) is compared with the MSO of the RAM entries (having a Tag bit MSO/LSO=1). If the comparison yields an exact match, such as for the submitted key 153.0.0.0 in Table 5, then the matched entry is a positive result for either a Binary CAM or an RCAM. If an exact match is not found, as in the case of the submitted key 154.0.0.0, then the search yields a range match, e.g., 153.22.33.2. Since 153.0.0.0 is a virtual address, it may be associated with a "Virtual bit"=1, indicating that this address is not a true exact match; the corresponding AD entry in this case is equal to that of the preceding actual entry, i.e., 152.17.35.2.

If the submitted key has at least one non-zero LSO, then its MSO is first compared with the MSO of the RAM entries (with MSO/LSO=1); this comparison determines a search range between an equal (or lower) value and the next higher value. For example, in the case of the submitted keys 153.4.3.6, 153.22.10.1 and 153.28.4.5, the search range lies between 153.0.0.0 and 155.0.0.0. Then, the three LSOs of the submitted key are compared with the three LSOs of the RAM entries (with MSO/LSO=0) within the specified search range. This comparison may yield an exact match, as for the submitted key 153.22.10.1, or range matches for 153.4.3.6 and 153.28.4.5, i.e., 153.0.0.0 and 153.22.33.2, respectively.

The examples above refer to "Key Tagging" Compression applied to CIDR IPv4 addresses with virtual entries, where the uncompressed entries are partitioned into two parts or fields, designated common parts and compressed entries. Tables 2 and 3 show examples where the common parts and the compressed entries have equal lengths; in Tables 4 and 5, the common parts have fewer bits than the compressed entries. It can be seen that, for a given length of uncompressed entries, compressed entries occupy larger memory space. On the other hand, larger common parts imply more potential changes in these parts and the addition of more virtual entries, because a virtual entry must be added whenever the first entry of a set of compressed entries corresponding to a changing common part has non-zero bits. Specifically, if a common part has n bits, the common part may undergo $2^n$ changes; thus, in the worst case, if the first compressed entry corresponding to a new common part has non-zero bits, then, $2^n$ virtual entries may be necessary. Since changing common parts are included among the compressed entries, then, if the same number of bits is assigned to all compressed entries, it is counterproductive to use common parts that are longer than the compressed entries, because then more virtual entries may be required, and, on the other hand, n>N/2 bits (where N is the number of bits per uncompressed entry) must be assigned to the compressed entries, increasing unnecessarily the storage space. Thus, common parts must always have $n \leq N/2$ bits for database compression. In general, a detailed analysis must be carried out on the rate and type of changes of the uncompressed entries in order to determine the optimal lengths of the common parts and compressed entries in each database. This analysis must take into account that each added virtual key entry requires the corresponding addition of an AD entry and extra storage space.

In more complex applications with large uncompressed entries, each uncompressed entry may be partitioned into more than two fields, consisting of a compound common part (with more than one field) and one compressed entry (with one field). The fields of the compressed entry and the compound common part may be tagged with Tag bits in binary notation, listing the fields in ascending order in binary notation. As the uncompressed entries change but the compound common part remains equal, each compressed entry in the RAM is tagged with "all zeros" Tag bits, indicating that the common part has not changed; all the contiguous compressed entries with "all zeros" Tag bits share a common part and are stored omitting this part. When a field of the compound common part changes, the compressed entry carries the value of the new field of the common part only, and is tagged with Tag bits that express its position in the uncompressed entry.

Table 6 shows, for comparison purposes, an example of this more complex "Key Tagging" Compression procedure applied to CIDR IPv4 addresses similar to those listed in Tables 2 and 4; in this example, the CIDR IPv4 addresses are partitioned into four parts of equal lengths (octets). The compound common part consists of the three more significant octets (MSOs) handled as three separate fields. The compressed entry may contain in most cases (when the compound common part does not change) the less significant octet (LSO) handled as a single field; otherwise, the compressed entry may contain one of the three MSOs. The specific octet (one of four) appearing as a compressed entry in the RAM is determined by two Tag bits, which list the four fields in binary notation, starting from the LSO field "00". When any of the four octets changes, the compressed entry representing the new uncompressed value carries the value of the new field with the Tag bits that indicate its position in the uncompressed entry. The changes in the uncompressed values start from the most significant octet. Similarly to Table 2, if a new group of CIDR IPv4 addresses starts with three non-zero LSOs, virtual addresses (shown shaded) with zero LSOs must be inserted to make this method applicable. The virtual address may be associated with "Virtual bit"=1, indicating that the matched entry is not an actual entry and cannot be a true exact match; the corresponding AD in this case may be equal to that of the preceding actual entry.

Table 7 shows the entries listed in Table 6, where the compressed entries are arranged in a RAM with four entries per row and the uncompressed entries of the RAM first column are listed in an FC-Register.

TABLE 6

"Key Tagging" Compression of CIDR IPv4 Entries with Virtual Entries Partitioned into Four Parts of Equal Lengths

| Uncompressed Actual Entries | | Uncompressed Actual & Virtual Entries | | Compressed Actual & Virtual Entries | |
|---|---|---|---|---|---|
| | | | | MSO/LSO Tag Bit | Data |
| | → | 152.0.0.0 | → | 11 | 152 |
| 152.15.0.0 | → | 152.15.0.0 | → | 10 | 15 |
| 152.15.3.0 | → | 152.15.3.0 | → | 01 | 3 |
| | → | 152.15.6.0 | → | 01 | 6 |
| 152.15.6.3 | → | 152.15.6.3 | → | 00 | 3 |
| | → | 152.15.9.0 | → | 01 | 9 |
| 152.15.9.5 | → | 152.15.9.5 | → | 00 | 5 |
| | → | 152.16.0.0 | → | 10 | 16 |
| | → | 152.16.2.0 | → | 01 | 2 |
| 152.16.2.3 | → | 152.16.2.3 | → | 00 | 3 |
| | → | 152.16.5.0 | → | 01 | 5 |
| 152.16.5.6 | → | 152.16.5.6 | → | 00 | 6 |
| | → | 152.16.8.0 | → | 01 | 8 |
| 152.16.8.1 | → | 152.16.8.1 | → | 00 | 1 |
| 152.16.32.0 | → | 152.16.32.0 | → | 01 | 32 |
| | → | 152.17.0.0 | → | 10 | 17 |
| | → | 152.17.3.0 | → | 01 | 3 |
| 152.17.3.3 | → | 152.17.3.3 | → | 00 | 3 |
| 152.17.6.0 | → | 152.17.6.0 | → | 01 | 6 |
| | → | 152.17.35.0 | → | 01 | 35 |
| 152.17.35.2 | → | 152.17.35.2 | → | 00 | 2 |
| | → | 153.0.0.0 | → | 11 | 153 |
| | → | 152.22.0.0 | → | 10 | 22 |
| | → | 153.22.10.0 | → | 01 | 10 |
| 153.22.10.1 | → | 153.22.10.1 | → | 00 | 1 |
| | → | 153.22.33.0 | → | 01 | 33 |
| 153.22.33.2 | → | 153.22.33.2 | → | 00 | 2 |
| | → | 155.0.0.0 | → | 11 | 155 |
| | → | 155.3.0.0 | → | 10 | 3 |
| | → | 155.3.3.0 | → | 01 | 3 |
| 155.3.3.6 | → | 155.3.3.6 | → | 00 | 6 |
| | → | 155.3.8.0 | → | 01 | 8 |
| 155.3.8.7 | → | 155.3.8.7 | → | 00 | 7 |
| | → | 156.0.0.0 | → | 11 | 156 |
| | → | 156.16.0.0 | → | 10 | 16 |
| | → | 156.16.7.0 | → | 01 | 7 |
| 156.16.7.15 | → | 156.16.7.15 | → | 00 | 15 |
| | → | 156.16.15.0 | → | 01 | 15 |
| 156.16.15.5 | → | 156.16.15.5 | → | 00 | 5 |
| | → | 157.0.0.0 | → | 11 | 157 |
| 157.5.0.0 | → | 157.5.0.0 | → | 10 | 5 |
| | → | 157.5.20.0 | → | 01 | 20 |
| 157.5.20.8 | → | 157.5.20.8 | → | 00 | 8 |

TABLE 7

"Key Tagging" Compression of CIDR IPv4 Entries with Virtual Entries Partitioned into Four Parts of Equal Lengths Stored in a RAM

| FC-Register (Uncompressed Entries) | RAM (Compressed Entries) | | | | | | | |
|---|---|---|---|---|---|---|---|---|
| | Tag | Data | Tag | Data | Tag | Data | Tag | Data |
| 152.0.0.0 | 11 | 152 | 10 | 15 | 01 | 3 | 01 | 6 |
| 152.15.6.3 | 00 | 3 | 01 | 9 | 00 | 5 | 10 | 16 |
| 152.16.2.0 | 01 | 2 | 00 | 3 | 01 | 5 | 00 | 6 |
| 152.16.8.0 | 01 | 8 | 00 | 1 | 01 | 32 | 00 | 0 |
| 152.17.0.0 | 10 | 17 | 01 | 3 | 00 | 3 | 01 | 6 |
| 152.17.6.0 | 00 | 0 | 01 | 35 | 00 | 2 | 11 | 153 |
| 152.22.0.0 | 10 | 22 | 01 | 10 | 00 | 1 | 01 | 33 |
| 153.22.33.2 | 00 | 2 | 11 | 155 | 10 | 3 | 01 | 3 |
| 155.3.3.6 | 00 | 6 | 01 | 8 | 00 | 7 | 11 | 156 |
| 156.16.0.0 | 10 | 16 | 01 | 7 | 00 | 15 | 01 | 15 |
| 156.16.15.5 | 00 | 5 | 11 | 157 | 10 | 5 | 01 | 20 |
| 157.5.20.8 | 00 | 8 | | | | | | |

Tables 6 and 7 show examples in which the CIDR IPv4 addresses are partitioned into four equal parts or fields consisting of a compound common part (with three fields) and one compressed entry (with one field). It can be seen that for a given length of uncompressed entries, the compressed entries have fewer bits than in above examples where the uncompressed entries are partitioned into two parts. However, due to the numerous changes in the three MSOs, too many virtual addresses must be inserted, and the increased number of added addresses outweighs the decrease of bits per compressed entry, causing an overall increase of storage space. If a common part has three fields consisting of $n_1$, $n_2$ and $n_3$ bits, then, in the worst case, $2 \exp(n_1+n_2+n_3)$ virtual entries may be necessary. The method of partitioning into four equal parts is convenient when the LSO changes repeatedly whereas the three MSOs change infrequently.

Table 8 shows an example of CIDR IPv4 addresses partitioned into four equal parts, where the three MSOs change less frequently as the fields grow in significance.

TABLE 8

"Key Tagging" Compression of CIDR IPv4 Entries Partitioned into Four Parts of Equal Lengths with Fewer Virtual Entries Stored in a RAM

| Uncompressed Actual Entries | | Uncompressed Actual & Virtual Entries | | Compressed Actual & Virtual Entries | |
|---|---|---|---|---|---|
| | | | | MSO/LSO Tag Bit | Data |
| | → | 152.0.0.0 | → | 11 | 152 |
| 152.15.0.0 | → | 152.15.0.0 | → | 10 | 15 |
| 152.15.3.0 | = | 152.15.3.0 | → | 01 | 3 |
| 152.15.3.5 | → | 152.15.3.5 | → | 00 | 5 |
| 152.15.3.10 | → | 152.15.3.10 | → | 00 | 10 |
| 152.15.3.15 | → | 152.15.3.15 | → | 00 | 15 |
| 152.15.3.20 | → | 152.15.3.20 | → | 00 | 20 |
| 152.15.3.25 | → | 152.15.3.25 | → | 00 | 25 |

TABLE 8-continued

"Key Tagging" Compression of CIDR IPv4 Entries Partitioned into Four Parts of Equal Lengths with Fewer Virtual Entries Stored in a RAM

| Uncompressed Actual Entries | | Actual & Virtual Entries (Uncompressed) | | Compressed Actual & Virtual Entries | |
|---|---|---|---|---|---|
| | | | | MSO/LSO Tag Bit | Data |
| | → | 152.15.6.0 | → | 01 | 6 |
| 152.15.6.3 | → | 152.15.6.3 | → | 00 | 3 |
| 152.15.6.6 | → | 152.15.6.6 | → | 00 | 6 |
| 152.15.6.9 | → | 152.15.6.9 | → | 00 | 9 |
| 152.15.6.12 | → | 152.15.6.12 | → | 00 | 12 |
| 152.15.6.15 | → | 152.15.6.15 | → | 00 | 15 |
| | → | 152.15.9.0 | → | 01 | 9 |
| 152.15.9.5 | → | 152.15.9.5 | → | 00 | 5 |
| 152.15.9.10 | → | 152.15.9.10 | → | 00 | 10 |
| 152.15.9.15 | → | 152.15.9.15 | → | 00 | 15 |
| 152.15.9.20 | → | 152.15.9.20 | → | 00 | 20 |
| 152.15.9.25 | → | 152.15.9.25 | → | 00 | 25 |
| | → | 152.16.0.0 | → | 10 | 16 |
| | → | 152.16.2.0 | → | 01 | 2 |
| 152.16.2.3 | → | 152.16.2.3 | → | 00 | 3 |
| 152.16.2.6 | → | 152.16.2.6 | → | 00 | 6 |
| 152.16.2.9 | → | 152.16.2.9 | → | 00 | 9 |
| 152.16.2.12 | → | 152.16.2.12 | → | 00 | 12 |
| 152.16.2.15 | → | 152.16.2.15 | → | 00 | 15 |
| | → | 152.16.5.0 | → | 01 | 5 |
| 152.16.5.6 | → | 152.16.5.6 | → | 00 | 6 |
| 152.16.5.12 | → | 152.16.5.12 | → | 00 | 12 |
| 152.16.5.18 | → | 152.16.5.18 | → | 00 | 18 |
| 152.16.5.24 | → | 152.16.5.24 | → | 00 | 24 |
| 152.16.5.30 | → | 152.16.5.30 | → | 00 | 30 |
| | → | 152.16.8.0 | → | 01 | 8 |
| 152.16.8.1 | → | 152.16.8.1 | → | 00 | 1 |
| 152.16.8.3 | → | 152.16.8.3 | → | 00 | 3 |
| 152.16.8.5 | → | 152.16.8.5 | → | 00 | 5 |
| 152.16.8.7 | → | 152.16.8.7 | → | 00 | 7 |
| 152.16.8.9 | → | 152.16.8.9 | → | 00 | 9 |
| 152.16.32.0 | → | 152.16.32.0 | → | 01 | 32 |
| 152.16.32.10 | → | 152.16.32.10 | → | 00 | 10 |
| 152.16.32.20 | → | 152.16.32.20 | → | 00 | 20 |
| 152.16.32.30 | → | 152.16.32.30 | → | 00 | 30 |
| 152.16.32.40 | → | 152.16.32.40 | → | 00 | 40 |
| | → | 152.17.0.0 | → | 10 | 17 |
| | → | 152.17.3.0 | → | 01 | 3 |
| 152.17.3.3 | → | 152.17.3.3 | → | 00 | 3 |
| 152.17.3.6 | → | 152.17.3.6 | → | 00 | 6 |
| 152.17.3.9 | → | 152.17.3.9 | → | 00 | 9 |
| 152.17.3.12 | → | 152.17.3.12 | → | 00 | 12 |
| 152.17.3.15 | → | 152.17.3.15 | → | 00 | 15 |
| 152.17.6.0 | → | 152.17.6.0 | → | 01 | 6 |
| 152.17.6.10 | → | 152.17.6.10 | → | 00 | 10 |
| 152.17.6.20 | → | 152.17.6.20 | → | 00 | 20 |
| 152.17.6.30 | → | 152.17.6.30 | → | 00 | 30 |
| 152.17.6.40 | → | 152.17.6.40 | → | 00 | 40 |
| | → | 152.17.35.0 | → | 01 | 35 |
| 152.17.35.2 | → | 152.17.35.2 | → | 00 | 2 |
| 152.17.35.4 | → | 152.17.35.4 | → | 00 | 4 |
| 152.17.35.6 | → | 152.17.35.6 | → | 00 | 6 |
| 152.17.35.8 | → | 152.17.35.8 | → | 00 | 8 |
| 152.17.35.10 | → | 152.17.35.10 | → | 00 | 10 |
| | → | 153.0.0.0 | → | 10 | 153 |
| | → | 153.22.0.0 | → | 10 | 22 |
| | → | 153.22.10.0 | → | 01 | 10 |
| 153.22.10.1 | → | 153.22.10.1 | → | 00 | 1 |
| 153.22.10.3 | → | 153.22.10.3 | → | 00 | 3 |
| 153.22.10.5 | → | 153.22.10.5 | → | 00 | 5 |
| 153.22.10.7 | → | 153.22.10.7 | → | 00 | 7 |
| 153.22.10.9 | → | 153.22.10.9 | → | 00 | 9 |
| | → | 153.22.33.0 | → | 01 | 33 |
| 153.22.33.2 | → | 153.22.33.2 | → | 00 | 2 |
| 153.22.33.4 | → | 153.22.33.4 | → | 00 | 4 |
| 153.22.33.6 | → | 153.22.33.6 | → | 00 | 6 |
| 153.22.33.8 | → | 153.22.33.8 | → | 00 | 8 |
| 153.22.33.10 | → | 153.22.33.10 | → | 00 | 10 |

Table 9 shows the entries listed in Table 8, where the compressed entries are arranged in a RAM with four entries per row and the uncompressed entries of the RAM first column are listed in an FC-Register.

TABLE 9

"Key Tagging" Compression of CIDR IPv4 Entries with Virtual Entries Partitioned into Four Parts of Equal Lengths Stored in a RAM

| FC-Register (Uncompressed Entries) | RAM (Compressed Entries) | | | | | | |
|---|---|---|---|---|---|---|---|
| | Tag | Data | Tag | Data | Tag | Data | Tag | Data |
| 152.0.0.0 | 11 | 152 | 10 | 15 | 01 | 3 | 00 | 5 |
| 152.15.3.10 | 00 | 10 | 00 | 15 | 00 | 20 | 00 | 25 |
| 152.15.6.0 | 01 | 6 | 00 | 3 | 00 | 6 | 00 | 9 |
| 152.15.6.12 | 00 | 12 | 00 | 15 | 01 | 9 | 00 | 5 |
| 152.15.9.10 | 00 | 10 | 00 | 15 | 00 | 20 | 00 | 25 |
| 152.16.0.0 | 10 | 16 | 01 | 2 | 00 | 3 | 00 | 6 |
| 152.16.2.9 | 00 | 9 | 00 | 12 | 00 | 15 | 01 | 5 |
| 152.16.5.6 | 00 | 6 | 00 | 12 | 00 | 18 | 00 | 24 |
| 152.16.5.30 | 00 | 30 | 01 | 8 | 00 | 1 | 00 | 3 |
| 152.16.8.5 | 00 | 5 | 00 | 7 | 00 | 9 | 01 | 32 |
| 152.16.32.0 | 00 | 10 | 00 | 20 | 00 | 30 | 00 | 40 |
| 152.17.0.0 | 10 | 17 | 01 | 3 | 00 | 3 | 00 | 6 |
| 152.17.3.9 | 00 | 9 | 00 | 12 | 00 | 15 | 01 | 6 |
| 152.17.6.10 | 00 | 10 | 00 | 20 | 00 | 30 | 00 | 40 |
| 152.17.35.0 | 01 | 35 | 00 | 2 | 00 | 4 | 00 | 6 |
| 152.17.35.8 | 00 | 8 | 00 | 10 | 11 | 153 | 10 | 22 |
| 153.22.10.0 | 01 | 10 | 00 | 1 | 00 | 3 | 00 | 5 |
| 153.22.10.7 | 00 | 7 | 00 | 9 | 01 | 33 | 00 | 2 |
| 153.22.33.4 | 00 | 4 | 00 | 6 | 00 | 8 | 00 | 10 |

Tables 8 and 9 show that for a given length of uncompressed entries, the method of partitioning into four equal parts is convenient when the LSO changes repeatedly whereas the three MSOs change infrequently. Generally, it is convenient to configure the MSOs of a compound common part (as the three fields in the above tables) to be equal; also, they may be equal or shorter than the LSO of a compressed entry. A detailed analysis must be carried out on the rate and type of changes of the uncompressed entries in order to determine the optimal lengths of the common parts and compressed entries in each database. This analysis must take into account that each added virtual key entry requires the corresponding addition of an AD entry and extra storage space.

As in the method of partitioning into two parts or fields, a key search in a RAM-Based Binary CAM or RCAM with compressed entries resulting from partitioning into four parts can be completed in two main steps. In the first step, a search is performed by a Search Row Locator in the FC-Register to identify the TDA row where the submitted key may be located. This step involves comparisons of uncompressed entries. In the second step, the row identified in the first step is searched for an exact match (for a Binary CAM) or a range match (for an RCAM); this step is more involved, it is performed using a sophisticated Search Column Locator, and depends whether the three LSOs of the submitted key are zero or non-zero.

If the submitted key has three zero LSOs, they are disregarded and the MSO (the common part) is compared with the MSO of the RAM entries (having Tag bits 11). If the comparison yields an exact match, such as for the submitted key 153.0.0.0 in Table 9, then the matched entry is a positive result for either a Binary CAM or an RCAM. If an exact matching entry is not found, as in the case of the submitted key 154.0.0.0, then the search yields a range match, e.g., 153.22.33.10. Since 153.0.0.0 is a virtual address, it may be associated with "Virtual bit"=1, indicating that this address is not a true exact match; the corresponding AD entry is in this case equal to that of the preceding actual entry, i.e., 152.17.35.10.

If the second MSO of the submitted key is also non-zero, then the first MSO is compared with the MSO of the RAM entries (with Tag bits=11); this comparison determines a search range between an equal (or lower) value and the next higher value. For example, in the case of the submitted keys 152.15.0.0, 152.16.0.0 and 152.18.0.0, the search range lies between 152.0.0.0 and 153.0.0.0. Then, the second MSO of the submitted key is compared with the second MSO of the RAM entries (with Tag bits 10) within the specified search range. This comparison may yield an exact match, as for the submitted keys 152.15.0.0 and 152.16.0.0, or a range match for 152.18.0.0, i.e., 152.17.35.10. Since 152.16.0.0 is a virtual address, it may be associated with "Virtual bit"=1, indicating that this address is not a true exact match; the corresponding AD entry in this case is equal to that of the preceding actual entry, i.e., 152.15.9.25.

If the third MSO of the submitted key is non-zero, then the two MSOs are compared with the two MSOs of the RAM entries (with Tag bits 11 and 10); these comparisons determine a search range between an equal (or lower) value and the next higher value. For example, in the case of the submitted keys 152.16.2.0, 152.16.4.0 and 152.16.6.0, the search range lies between 152.16.0.0 and 152.17.0.0. Then, the two MSOs of the submitted key are compared with the two MSOs of the RAM entries (with Tag bits 11 and 10) within the specified search range. This comparison may yield an exact match, as for the submitted key 152.16.2.0, or a range match for 152.16.4.0 and 152.16.6.0, i.e., 152.16.2.15 and 152.16.5.30, respectively. Since 152.16.2.0 is a virtual address, it may be associated with a "Virtual bit"=1, indicating that this address is not a true exact match; the corresponding AD entry is in this case equal to that of the preceding actual entry, i.e., 152.15.9.25.

A different approach may be applied when the CIDR IPv4 addresses are handled using the representation of HyWire Ltd., as disclosed in U.S. Pat. No. 6,663,953, and stored in RAMs, as disclosed in U.S. Patent Application Publication No. 20030093646. In this representation, the CIDR IPv4 addresses are converted into equivalent non-overlapping ranges, each having a closed lower boundary and an open upper boundary. If the non-overlapping ranges are not adjacent, they are made adjacent by interpolating "virtual" key ranges in the empty intervals between them. These "virtual" ranges are not proper ranges, because they have open lower boundaries and closed upper boundaries. The range validity (or invalidity) is indicated by a closed/open boundary bit; the ADs corresponding to invalid ranges have no meaning. Adjacent ranges yield a compact representation, in which each shared boundary appears once instead of twice in the "conventional" adjacent range notation; that is, only the lower boundary of each range is used, instead of both the lower and upper boundaries (except for the last range in an array, whose upper boundary is listed at the end). The lower boundaries of CIDR IPv4 addresses have generally a number of 'all zero' less significant bits; thus, if a set of these addresses have each at least an entire 'all zero' less significant octet (LSO), this LSO can be extracted, and the three more significant octets (MSOs) of the addresses can be stored as compressed entries. When this method is implemented in a RAM-Based RCAM, the FC-Register may store the uncompressed entries (including the 'all zero' LSO), whereas the RAM itself stores the compressed entries. A tag can be used to indicate, for instance, the number of extracted 'all zero' LSOs. Table 10 shows an application of this compression method.

TABLE 10

"Key Tagging" Compression of CIDR IPv4 Entries with 'All Zero' LSOs Extracted as a Common Part

| Uncompressed Entries | Compressed Entries | |
|---|---|---|
| | No. of 'All 0' LSOs | Data |
| 101.1.2.0 | → | 1 | 101.1.2 |
| 101.1.3.0 | → | 1 | 101.1.3 |
| 101.1.253.0 | → | 1 | 101.1.253 |
| 101.1.254.0 | → | 1 | 101.1.254 |
| 101.2.0.0 | → | 2 | 101.2 |
| 101.3.0.0 | → | 2 | 101.3 |
| 101.4.0.0 | → | 2 | 101.4 |
| 101.252.32.0 | → | 1 | 101.252.32 |
| 101.252.36.0 | → | 1 | 101.252.36 |
| 101.253.0.0 | → | 2 | 101.253 |
| 101.254.0.0 | → | 2 | 101.254 |
| 101.254.64.0 | → | 1 | 101.254.64 |
| 101.254.96.0 | → | 1 | 101.254.96 |
| 130.5.5.0 | → | 1 | 130.5.5 |
| 130.5.6.0 | → | 1 | 130.5.6 |
| 140.25.0.0 | → | 2 | 140.25 |
| 140.25.1.0 | → | 1 | 140.25.1 |
| 140.25.2.0 | → | 1 | 140.25.2 |
| 140.25.4.0 | → | 1 | 140.25.4 |
| 140.25.255.0 | → | 1 | 140.25.255 |
| 140.26.0.0 | → | 2 | 140.26 |
| 160.10.2.0 | → | 1 | 160.10.2 |
| 160.10.3.0 | → | 1 | 160.10.3 |
| 160.10.100.0 | → | 1 | 160.10.100 |
| 160.10.101.0 | → | 1 | 160.10.101 |
| 160.11.0.0 | → | 2 | 160.11 |
| 160.12.0.0 | → | 2 | 160.12 |
| 172.16.224.0 | → | 1 | 172.16.224 |
| 172.17.0.0 | → | 2 | 172.17 |
| 175.100.38.0 | → | 1 | 175.100.38 |
| 175.100.40.0 | → | 1 | 175.100.40 |
| 175.100.48.0 | → | 1 | 175.100.48 |
| 175.100.64.0 | → | 1 | 175.100.64 |
| 175.100.80.0 | → | 1 | 175.100.80 |
| 175.100.88.0 | → | 1 | 175.100.88 |
| 175.100.92.0 | → | 1 | 175.100.92 |
| 192.168.25.0 | → | 1 | 192.168.25 |
| 192.168.26.0 | → | 1 | 192.168.26 |
| 193.1.1.0 | → | 1 | 193.1.1 |
| 193.1.2.0 | → | 1 | 193.1.2 |

Table 11 shows the entries listed in Table 10, where the compressed entries are arranged in a RAM-Based Binary RCAM with four entries per row and the uncompressed entries of the RAM first column are listed in an FC-Register.

TABLE 11

"Key Tagging" Compression of CIDR IPv4 Entries with 'All Zero' LSOs Extracted as a Common Part

| FC-Register (Uncompressed Entries) | RAM (Compressed Entries) | | | | | | | |
|---|---|---|---|---|---|---|---|---|
| | Tag | Data | Tag | Data | Tag | Data | Tag | Data |
| 101.1.2.0 | 1 | 101.1.2 | 1 | 101.1.3 | 1 | 101.1.253 | 1 | 101.1.254 |
| 101.2.0.0 | 2 | 101.2 | 2 | 101.3 | 2 | 101.4 | 1 | 101.252.32 |
| 101.252.36.0 | 1 | 101.252.36 | 1 | 101.253 | 1 | 101.254 | 1 | 101.254.64 |
| 101.254.224.0 | 1 | 101.254.96 | 1 | 130.5.5 | 1 | 130.5.6 | 2 | 140.25 |
| 140.25.1.0 | 1 | 140.25.1 | 1 | 140.25.2 | 1 | 140.25.4 | 1 | 140.25.255 |
| 140.26.0.0 | 2 | 140.26 | 1 | 160.10.2 | 1 | 160.10.3 | 1 | 160.10.100 |
| 160.10.101.0 | 1 | 160.10.101 | 2 | 160.11 | 2 | 160.12 | 1 | 172.16.224 |
| 172.17.0.0 | 2 | 172.17 | 1 | 175.100.38 | 1 | 175.100.40 | 1 | 175.100.48 |
| 175.100.64.0 | 1 | 175.100.64 | 1 | 175.100.80 | 1 | 175.100.88 | 1 | 175.100.92 |
| 192.168.253.0 | 1 | 192.168.25 | 1 | 192.168.26 | 1 | 193.1.1 | 1 | 193.1.2 |

Memory Partitioning Method

In the simplest application of this method, each uncompressed entry is partitioned into two parts: a "common part" and a "compressed entry", where each part can be handled as a field. The database storage space (memory) can be partitioned so that all the entries having the same common part are arranged in the same memory partition, and entries with different common parts are kept in separate memory partitions. In this way, each memory partition may contain only one uncompressed entry and compressed entries, in which this common part is omitted, yielding significant storage saving. Each uncompressed entry can be partitioned into two equal parts or more generally into two unequal parts or fields. The uncompressed entries can represent Binary Keys (single integers) or Range Keys (range boundaries), as described in U.S. Patent Application Publication No. 20030093646.

Table 12 shows an application of this method for compressing 8-bit words into two parts or fields of different length: a common part, consisting of the 2 most significant bits, and compressed entries, consisting of the remaining 6 bits.

When implemented in a RAM-Based Binary CAM or RCAM, the FC-Register stores the uncompressed entries of the first column of the internal or external RAM, whereas the RAM itself stores the corresponding compressed entries, omitting the common part. As long as the common part remains equal, the compressed entries sharing this common part value are sequentially stored in contiguous rows in the RAM. When the value of the common part changes, the corresponding compressed entries sharing the new value are sequentially stored starting from a new row. Thus, compressed entries sharing different common part values are stored in separate groups of RAM rows in correspondence with the FC-Register Key entries. The storage of compressed entries instead of entire uncompressed entries yields significant storage saving in the RAM.

TABLE 12

"Memory Partitioning" Compression of Entries Partitioned into Two Parts in Separate Memory Partitions

| Uncompressed Entries | | Compressed Entries |
|---|---|---|
| 00000000 | → | 000000 |
| | → | 000010 |
| | → | 000100 |
| | → | 000110 |
| | → | 000111 |

TABLE 12-continued

"Memory Partitioning" Compression of Entries Partitioned into Two Parts in Separate Memory Partitions

| Uncompressed Entries | | Compressed Entries |
|---|---|---|
| | → | 010001 |
| | → | 011000 |
| | → | 011010 |
| | → | 011100 |
| | → | 011101 |
| | → | 100100 |
| | → | 100110 |
| | → | 100111 |
| | → | 101001 |
| | → | 110000 |
| | → | 110010 |
| | → | 110100 |
| | → | 110110 |
| 01000000 | → | 000000 |
| | → | 001010 |
| | → | 001100 |
| | → | 001110 |
| | → | 001111 |
| | → | 010000 |
| | → | 010100 |
| | → | 011000 |
| | → | 011001 |
| | → | 011010 |
| | → | 011011 |
| | → | 011100 |
| | → | 011110 |
| | → | 011111 |
| | → | 100000 |
| | → | 100010 |
| | → | 100011 |
| | → | 100100 |
| | → | 100101 |
| | → | 100110 |
| | → | 101110 |
| 10000000 | → | 000000 |
| | → | 000010 |
| | → | 000100 |
| | → | 000110 |
| | → | 000111 |
| | → | 010001 |
| | → | 011000 |
| | → | 011010 |
| | → | 011100 |
| | → | 011101 |
| | → | 100100 |
| | → | 100110 |
| | → | 100111 |
| | → | 101001 |
| | → | 110000 |

TABLE 12-continued

"Memory Partitioning" Compression of Entries Partitioned into Two Parts in Separate Memory Partitions

| Uncompressed Entries | | Compressed Entries |
|---|---|---|
| | → | 110010 |
| | → | 110100 |
| | → | 110110 |
| 11000000 | → | 000000 |
| | → | 001010 |
| | → | 001100 |
| | → | 001110 |
| | → | 001111 |
| | → | 010000 |
| | → | 010100 |
| | → | 011000 |
| | → | 011001 |
| | → | 011010 |

Table 13 shows an example of an FC-Register that stores 8-bit uncompressed entries of the first column of a RAM that contains the corresponding compressed entries, omitting the 2-bit common part. Since the common part consists of 2 bits, it can assume 4 values, so that the RAM may include up to 4 groups of separate rows.

TABLE 13

"Memory Partitioning" Compression of Binary or Range Keys in a RAM

| FC-Register | RAM (Compressed Entries) | | | | | | |
|---|---|---|---|---|---|---|---|
| 00000000 | 000000 | 000010 | 000100 | 000110 | 000111 | 010001 | 011000 |
| 00011010 | 011010 | 011100 | 011101 | 100100 | 100110 | 100111 | 101001 |
| 00110000 | 110000 | 110010 | 110100 | 110110 | | | |
| 01000000 | 000000 | 001010 | 001100 | 001110 | 001111 | 010000 | 010100 |
| 01011000 | 011000 | 011001 | 011010 | 011011 | 011100 | 011110 | 011111 |
| 01011111 | 100000 | 100010 | 100011 | 100100 | 100101 | 100110 | 101110 |
| 10000000 | 000000 | 000010 | 000100 | 000110 | 000111 | 010001 | 011000 |
| 10011010 | 011010 | 011100 | 011101 | 100100 | 100110 | 100111 | 101001 |
| 10110000 | 110000 | 110010 | 110100 | 110110 | | | |
| 11000000 | 000000 | 001010 | 001100 | 001110 | 001111 | 010000 | 010100 |
| 11011000 | 011000 | 011001 | 011010 | | | | |

A key search in a RAM-Based Binary CAM or RCAM can be completed in two steps. In the first step, a search is performed by a Search Row Locator in the FC-Register to identify the RAM row where the submitted key may be located. This step is identical for Binary CAMs and RCAMs. In the second step, the common part is omitted in the submitted key and the row identified in the first step is searched for an exact match (for a Binary CAM) or a range match (for an RCAM). This step is performed using a Search Column Locator. The two-step Key Search can be performed sequentially, requiring two clocks for execution, or in pipelined mode, which enables search result output at full clock rate.

When new keys are inserted in the RAM within a group of rows sharing the same common part, the entries in these rows are repositioned (by insertion and shifting) until the last row in this group is filled; then, a new contiguous row must be added for the next inserted key, and the succeeding rows must be shifted down. Similarly, if keys are removed and a row is emptied, the succeeding rows must be shifted up.

If the FC-Register has Row Index entries associated with its Key entries that point to the physical RAM rows, then the RAM rows can be arranged in a flexible non-contiguous order. Table 14 shows the same entries listed in the FC-Register and the RAM as in Table 13, but in this case the FC-Register has entries that determine the order of the RAM rows.

TABLE 14

"Memory Partitioning" Compression of Binary or Range Keys in a RAM with Row Index Ordering

| FC-Register | | RAM | | | | | | |
|---|---|---|---|---|---|---|---|---|
| Entries | RIs* | Compressed Entries | | | | | | |
| 00000000 |  | 000000 | 000010 | 000100 | 000110 | 000111 | 010001 | 011000 |
| 00011010 |  | 110000 | 110010 | 110100 | 110110 | | | |
| 00110000 |  | 011010 | 011100 | 011101 | 100100 | 100110 | 100111 | 101001 |
| 01000000 |  | 011000 | 011001 | 011010 | 011010 | 011011 | 011100 | 011110 |
| 01011000 |  | 000000 | 001010 | 001100 | 001110 | 001111 | 010000 | 010100 |

TABLE 14-continued

"Memory Partitioning" Compression of Binary or Range Keys
in a RAM with Row Index Ordering

| FC-Register | | RAM |
|---|---|---|
| Entries | RIs* | Compressed Entries |

| Entries | RIs* | Compressed Entries | | | | | |
|---|---|---|---|---|---|---|---|
| 01011111 | 1000 | 100110 | 101110 | | | | |
| 01100110 | 0101 | 000000 | 000010 | 000100 | 000110 | 000111 | 010001 | 011000 |
| 10000000 | 0110 | 110000 | 110010 | 110100 | 110110 | | | |
| 10011010 | 1010 | 011111 | 100000 | 100010 | 100011 | 100100 | 100101 | 100110 |
| 10110000 | 0111 | 000000 | 001010 | 001100 | 001110 | 001111 | 010000 | 010100 |
| 11000000 | 1001 | 011010 | 011100 | 011101 | 100100 | 100110 | 100111 | 101001 |
| 11011000 | 1011 | 011000 | 011001 | 011010 | | | | |

*Note:
RIs means Row Indices.

As before, the key search in the RAM-Based Binary CAM or RCAM can be completed in two steps. In the first step, a search is performed in an identical fashion by a Search Row Locator in the FC-Register, to identify the Key entry and the corresponding RAM row (pointed to by the FC-Register Row Index entry) where the submitted key may be located. In the second step, the common part is omitted in the submitted key and the row identified in the first step is searched for an exact match (for a Binary CAM) or a range match (for an RCAM).

In this configuration, when new keys are inserted in the RAM within a group of rows sharing the same common part, the entries in these rows are repositioned (by insertion and shifting) until the last row in this group is filled, as before. However, the next key can be inserted in any empty row, and this row can be designated as the succeeding row by a Row Index entry in the FC-Register; then, the addition of a new row does not require the shift-down of the succeeding rows. Similarly, if keys are removed and a row is emptied, the succeeding rows do not require shifting up.

"Memory Partitioning" Compression requires handling of special cases, such as empty entries in the RAM and non-contiguous common part values in the FC-Register.

The case of empty uncompressed entries in the RAM may be handled in alternative ways. One alternative is filling these entries with "all ones", based on the assumption that no valid key entry has this value. A second alternative is to fill these entries with "all zeros", based on the assumption that a zero value can only be used as the lowest key entry in the RAM, corresponding to the smallest single integer key in a Binary CAM or to the lowest range boundary in an RCAM. These two "filling" methods are readily applicable to uncompressed key entries; however, when compressed as described above, the "all ones" values of compressed "filling" entries cannot be differentiated from compressed "valid" entries with "all ones" values. Then, a "Valid bit" may be associated with each key entry which indicates the non-validity of the "filling" entries in contrast to the compressed "valid" entries with "all ones". This "Valid bit" may be stored with the key entries or with the AD entries in a separate RAM. In case of "filling" entries, the AD entry of the first "filling" entry may be equal to that of the preceding "valid" entry in the row. A different approach may be used, where the number of "valid" key entries in each row is indicated next to the Row Index entries in the FC-Register and the empty key entries in the row are disregarded. Table 15 shows the same entries listed in the FC-Register and the RAM as in Table 14, but in this case the FC-Register includes the number of "valid" key entries per row.

TABLE 15

"Memory Partitioning" Compression of Binary or Range Keys
in a RAM with Row Index Ordering and Numbering of Row Entries per Row

| FC-Register | | | RAM |
|---|---|---|---|
| Entries | RIs* | NEs* | Compressed Entries |

| Entries | RIs* | NEs* | Compressed Entries | | | | | | |
|---|---|---|---|---|---|---|---|---|---|
| 00000000 | 0000 | 111 | 000000 | 000010 | 000100 | 000110 | 000111 | 010001 | 011000 |
| 00011010 | 0010 | 111 | 110000 | 110010 | 110100 | 110110 | | | |

TABLE 15-continued

"Memory Partitioning" Compression of Binary or Range Keys
in a RAM with Row Index Ordering and Numbering of Row Entries per Row

| Entries | RIs* | NEs* | Compressed Entries | | | | | | |
|---|---|---|---|---|---|---|---|---|---|
| 00110000 | 0001 | 100 | 011010 | 011100 | 011101 | 100100 | 100110 | 100111 | 101001 |
| 01000000 | 0100 | 111 | 011000 | 011001 | 011010 | 011010 | 011011 | 011100 | 011110 |
| 01011000 | 0011 | 111 | 000000 | 001010 | 001100 | 001110 | 001111 | 010000 | 010100 |
| 01011111 | 1000 | 111 | 100110 | 101110 | | | | | |
| 01100110 | 0101 | 010 | 000000 | 000010 | 000100 | 000110 | 000111 | 010001 | 011000 |
| 10000000 | 0110 | 111 | 110000 | 110010 | 110100 | 110110 | | | |
| 10011010 | 1010 | 111 | 011111 | 100000 | 100010 | 100011 | 100100 | 100101 | 100110 |
| 10110000 | 0111 | 100 | 000000 | 001010 | 001100 | 001110 | 001111 | 010000 | 010100 |
| 11000000 | 1001 | 111 | 011010 | 011100 | 011101 | 100100 | 100110 | 100111 | 101001 |
| 11011000 | 1011 | 011 | 011000 | 011001 | 011010 | | | | |

*Note:
RIs means Row Indices; NEs means Number of Entries per row.

The case of non-contiguous common part values requires a procedure for handling submitted keys having one of the common parts that are missing in the FC-Register. Table 16 shows an example of a RAM in which (for simplicity) the rows are arranged in contiguous ascending order and the common part 10 is missing in the FC-Register.

TABLE 16

"Memory Partitioning" Compression of Binary or Range Keys
in a RAM having a Missing Common Part

| Entries | RIs | NEs | Compressed Entries | | | | | | |
|---|---|---|---|---|---|---|---|---|---|
| 00000000 | 0000 | 111 | 000000 | 000010 | 000100 | 000110 | 000111 | 010001 | 011000 |
| 00011010 | 0001 | 111 | 011010 | 011100 | 011101 | 100100 | 100110 | 100111 | 101001 |
| 00110000 | 0010 | 100 | 110000 | 110010 | 110100 | 110110 | | | |
| 01000000 | 0011 | 111 | 000000 | 001010 | 001100 | 001110 | 001111 | 010000 | 010100 |
| 01011000 | 0100 | 111 | 011000 | 011001 | 011010 | 011010 | 011011 | 011100 | 011110 |
| 01011111 | 0101 | 111 | 011111 | 100000 | 100010 | 100011 | 100100 | 100101 | 100110 |
| 01100110 | 0110 | 010 | 100110 | 101110 | | | | | |

TABLE 16-continued

"Memory Partitioning" Compression of Binary or Range Keys
in a RAM having a Missing Common Part

| FC-Register | | | RAM | | | | | |
|---|---|---|---|---|---|---|---|---|
| Entries | RIs | NEs | Compressed Entries | | | | | |
| 11000000 | 0111 | 111 | 000000 | 001010 | 001100 | 001110 | 001111 | 010000 010100 |
| 11011000 | 1000 | 011 | 011000 | 011001 | 011010 | | | |

Whenever a key having a missing common part is submitted, the search procedure must lead to the last "valid" entry of the last row having the preceding common part. If, for example, the key 10001100 is submitted for search in the RAM shown in Table 16, since the common part 10 is missing, the last compressed entry corresponding to the common part 01, i.e., 101110 (uncompressed entry=01101110), is selected as the searched entry.

One way of proceeding in case of missing common parts is adding an empty row for each missing common part and indicating that the row is empty by writing "all zeros" in the Number of Entries (NEs) column of the FC-Register. In this approach, a virtual uncompressed entry 10000000 is added in the FC-Register between 01100110 and 11000000, with RI=1001 and NE=000; and an empty row is added after the occupied rows in the RAM; the Row Indices of the occupied rows do not change. When the key 10001100 is submitted, the selected key is the first empty entry of the empty row, which has an associated "Valid bit" that indicates this entry is not valid and an AD entry that is equal to that of the last "valid" entry in the preceding row, i.e., 101110.

An alternative way for handling a missing common part is to search for an exact match of the submitted key with the uncompressed entries in the FC-Register, and if the common part of the submitted key is missing, to select the last "valid" entry of the last row having the preceding common part value; this procedure leads to the same searched entry as the previous one.

As mentioned hereinabove, when using the range representation of HyWire Ltd., the lower boundaries of CIDR IPv4 addresses have generally a number of 'all zero' less significant octets (LSOs); these LSOs can be extracted and the remaining more significant octets (MSOs) of the addresses can be stored as compressed entries. This compression method, presented hereinabove and exemplified in Table 10, can be combined with the "Memory Partitioning" method also presented hereinabove, in which the memory is partitioned so that each set of entries having the same MSOs (common part) is arranged in the same memory partition, and entries with different common parts are kept in separate memory partitions. This combined procedure provides further storage space saving, because each memory partition contains only one compressed entry (without the 'all zero' LSOs) and a set of further compressed entries (where the common MSOs are omitted).

Table 17 shows an application of this combined compression method using the same CIDR IPv4 addresses listed in Table 10 (in dotted-decimal notation), where the common MSO can be omitted in each memory partition.

TABLE 17

Compression of CIDR IPv4 Entries Combining "Key Tagging"
(with 'All Zero' LSOs Extracted as a Common Part) and
"Memory Partitioning" Methods

| Uncompressed Entries | | Compressed Entries | |
|---|---|---|---|
| | | No. of 'All 0' LSOs | Data |
| 101.1.2.0 | → | 1 | 1.2 |
| | → | 1 | 1.3 |
| | → | 1 | 1.253 |
| | → | 1 | 1.254 |
| | → | 2 | 2 |
| | → | 2 | 3 |
| | → | 2 | 4 |
| | → | 1 | 252.32 |
| | → | 1 | 252.36 |
| | → | 2 | 253 |
| | → | 2 | 254 |
| | → | 1 | 254.64 |
| | → | 1 | 254.96 |
| 130.5.5.0 | → | 1 | 5.5 |
| | → | 1 | 5.6 |
| 140.25.0.0 | → | 2 | 25 |
| | → | 1 | 25.1 |
| | → | 1 | 25.2 |
| | → | 1 | 25.4 |
| | → | 1 | 25.255 |
| | → | 2 | 26 |
| 160.10.2.0 | → | 1 | 10.2 |
| | → | 1 | 10.3 |
| | → | 1 | 10.100 |
| | → | 1 | 10.101 |
| | → | 2 | 11 |
| | → | 2 | 12 |
| 172.16.224.0 | → | 1 | 16.224 |
| | → | 2 | 17 |
| 175.100.38.0 | → | 1 | 100.38 |
| | → | 1 | 100.40 |
| | → | 1 | 100.48 |
| | → | 1 | 100.64 |
| | → | 1 | 100.80 |
| | → | 1 | 100.88 |
| | → | 1 | 100.92 |
| 192.168.25.0 | → | 1 | 168.25 |
| | → | 1 | 168.26 |
| 193.1.1.0 | → | 1 | 1.1 |
| | → | 1 | 1.2 |

Table 18 shows an implementation of this combined compression method in a RAM-Based RCAM with four entries per row. The FC-Register stores the uncompressed entries, whereas the RAM itself stores the compressed entries omitting the common MSOs arranged in the same memory partition and the 'all zero' LSOs. A tag is used to indicate the number of extracted 'all zero' LSOs. The compressed entries sharing a common MSO are stored in a separate set of rows, so compressed entries with different MSOs are stored in different groups of rows in the RAM in correspondence with the FC-Register Key entries.

As used herein in the specification and in the claims section that follows, the term "monotonic order" and the like refer to one or more rows (or one or more columns) in an array in which the compressed data entries, upon expansion to uncompressed data entries corresponding to the compressed data entries, yield uncompressed data entries that are in ascending order or in descending order. This can be achieved in various ways, as demonstrated hereinabove. The term "monotonic order" specifically includes rows having a cyclic monotonic order, e.g., 9, 15, 69, 81, 2, 4, 7, or 23, 105, 222, 611, 8, 14. The term "monotonic order" specifically includes a logically monotonic order in which indices, pointers, etc., are used to identify a physical location of the compressed data entries.

within the spirit and broad scope of the appended claims. All publications, patents and patent applications mentioned in this specification, including U.S. Patent Application Publication Nos. 20030093646, 20040019737, and 20040049630, U.S. patent application Ser. No. 10/928,257, and U.S. Pat. No. 6,663,953, are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

What is claimed is:

1. A computer-implemented method of compressing key entries within an associative search engine, the method comprising the steps of:

TABLE 18

Compression of CIDR IPv4 Entries Combining "Key Tagging" and "Memory Partitioning" Methods in a RAM

| FC-Register (Uncompressed Entries) | RAM (Compressed Entries) | | | | | | |
|---|---|---|---|---|---|---|---|
| | Tag | Data | Tag | Data | Tag | Data | Tag | Data |
| 101.1.2.0 | 1 | 1.2 | 1 | 1.3 | 1 | 1.253 | 1 | 1.254 |
| 101.2.0.0 | 2 | 2 | 2 | 3 | 2 | 4 | 1 | 252.32 |
| 101.252.36.0 | 1 | 252.36 | 2 | 253 | 2 | 254 | 1 | 254.64 |
| 101.254.224.0 | 1 | 254.96 | | | | | | |
| 130.5.5.0 | 1 | 5.5 | 1 | 5.6 | 1 | | 2 | |
| 140.25.0.0 | 2 | 25 | 1 | 25.1 | 1 | 25.2 | 1 | 25.4 |
| 140.25.255.0 | 1 | 25.255 | 2 | 26 | | | | |
| 160.10.2.0 | 1 | 10.2 | 1 | 10.3 | 1 | 10.100 | 1 | 10.101 |
| 160.11.0.0 | 2 | 11 | 2 | 12 | | | 1 | |
| 172.16.224.0 | 1 | 16.224 | 2 | 17 | | | | |
| 175.100.38.0 | | 100.38 | 1 | 100.40 | 1 | 100.48 | 1 | 100.64 |
| 175.100.80.0 | 1 | 100.80 | 1 | 100.88 | 1 | 100.92 | | |
| 192.168.253.0 | 1 | 168.25 | 1 | 168.26 | | | | |
| 192.168.25.0 | 1 | 168.25 | 1 | 168.26 | | | | |

As used herein in the specification and in the claims section that follows, the term "monotonically-adjacent entry" refers to a data entry that is numerically closest (either higher or lower, depending on the arbitrary procedure of the data input scheme) to a specified data entry, irrespective of where the data entry is physically stored, and irrespective of the actual form in which the data entry is stored. Typically, the monotonically-adjacent entry is an uncompressed data entry.

As used herein in the specification and in the claims section that follows, the term "common section" refers to a pre-determined part of a data entry, wherein the predetermined part changes infrequently from data entry to data entry.

As used herein in the specification and in the claims section that follows, the term "identical common section" refers to a common section, defined hereinabove, in which the pre-determined part is identical for a particular plurality of uncompressed data entries.

As used herein in the specification and in the claims section that follows, the term "differentiating section" refers to a pre-determined part of a data entry that changes frequently from data entry to data entry.

Although the invention has been described in conjunction with specific embodiments thereof, it is evident that many alternatives, modifications and variations will be apparent to those skilled in the art. Accordingly, it is intended to embrace all such alternatives, modifications and variations that fall (a) inputting a plurality of original key entries into a computer implemented memory within the associative search engine;

(b) partitioning a particular original key entry of said original key entries, into at least two sections of bits, said at least two sections including both a first, common section and a second, differentiating section with respect to other said original key entries, each of said common section and said differentiating section having a predetermined length;

(c) determining, by comparison of said particular original key entry with a monotonically-adjacent key entry, if a match exists in said common section, and (d) providing a particular compressed key entry for said particular original key entry, said compressed entry including compressed data corresponding to said particular original key entry, wherein if, in step (c), said match exists in said common section, said compressed data includes said differentiating section of said particular original key entry;

(e) performing steps (b), (c), and (d) for each of said plurality of original key entries, and (f) arranging said compressed data to produce a monotonically ordered, compressed database associated with the associative search engine.

2. The method of claim 1, wherein a no-match condition exists in said common section, the method further comprising the step of:
(g) inserting a virtual compressed key entry between said particular compressed entry and said monotonically-adjacent entry.

3. The method of claim 2, wherein said virtual compressed entry includes data corresponding to said common section of said key entry.

4. The method of claim 1, wherein a difference exists in said common section, the method further comprising the step of:
(g) providing an indication of said difference.

5. The method of claim 4, wherein said indication is indicated by a tag.

6. The method of claim 1, wherein, for all of said original key entries, said common section includes a higher-level section of more significant bits with respect to said differentiating section.

7. The method of claim 1, wherein, for all of said original key entries, said differentiating section includes a higher-level section of more significant bits with respect to said common section.

8. The method of claim 4, wherein at least two specific key entries of said plurality of original key entries have an identical common section, and wherein said identical common section is extracted from said at least two specific key entries, and is stored in said database.

9. The method of claim 8, wherein said particular compressed key entry, along with said identical common section and said indication, contain information requisite for an exact reconstruction of said particular original key entry.

10. The method of claim 1, further comprising the step of:
(g) searching within said compressed data of said monotonically ordered, compressed database, to find a match to an uncompressed key entry.

11. The method of claim 1, wherein said common section and said differentiating section of said particular original key entry are stored in separate memory partitions.

12. A computer-implemented method of compressing key entries within an associative search engine, the method comprising the steps of:
(a) inputting a plurality of original key entries into a computer-implemented memory within the associative search engine;
(b) partitioning each particular original key entry of said original key entries, into at least a common section and a differentiating section of bits, to produce a plurality of different common sections and a plurality of different differentiating sections of said bits, each of said common sections and said differentiating sections having a predetermined length;
(c) for each specific key entry of said original key entries in which said common section is an identical common section, with respect to at least another of said original key entries:
(i) extracting said identical common section from said each specific key entry;
(ii) storing, in a database associated with the associative search engine, said identical common section extracted from said each specific key entry, and
(iii) arranging said plurality of different differentiating sections in an ascending or descending order, within said database, to produce a compressed database associated with the associative search engine.

13. The method of claim 12, further comprising the step of:
(d) arranging said plurality of different common sections in an ascending or descending order within said database.

14. The method of claim 12, further comprising the step of:
(d) searching said plurality of different differentiating sections within said compressed database to find a match to an uncompressed key entry.

15. The method of claim 12, wherein, for all of said original key entries, said common section includes a higher-level section of more significant bits with respect to said differentiating section.

16. A computer-implemented method of compressing key entries within an associative search engine, the method comprising the steps of:
(a) inputting a plurality of original key entries into a computer-implemented memory within the associative search engine;
(b) partitioning each particular original key entry of said original key entries, into at least a common section and a differentiating section of bits, to produce a plurality of different common sections and a plurality of different differentiating sections of said bits, each of said common sections and said differentiating sections having a predetermined length;
(c) for each specific key entry of said original key entries in which said common section is an identical common section, with respect to at least another of said original key entries:
(i) extracting said identical common section from said each specific key entry;
(ii) storing, in a database associated with the associative search engine, said identical common section extracted from said each specific key entry, and
(iii) arranging said plurality of different differentiating sections in an ascending or descending order, within said database, to produce a compressed database associated with the associative search engine, and
(d) arranging said plurality of different common sections in an ascending or descending order within said database,
wherein, upon decompression of said compressed database, all of said plurality of original key entries are obtained.

17. The method of claim 16, further comprising the step of:
(e) searching said plurality of different differentiating sections within said compressed database to find a match to an uncompressed key entry.

18. The method of claim 16, wherein, for all of said original key entries, said common section includes a higher-level section of more significant bits with respect to said differentiating section.

19. The method of claim 16, wherein, for all of said original key entries, said differentiating section includes a higher-level section of more significant bits with respect to said common section.

* * * * *